United States Patent
Rangan et al.

(10) Patent No.: US 7,786,912 B2
(45) Date of Patent: Aug. 31, 2010

(54) SIGMA DELTA CONVERTER SYSTEM AND METHOD

(75) Inventors: Giri N K Rangan, Bangalore (IN); Roger Levinson, Los Gatos, CA (US); John M Caruso, Danville, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/999,256

(22) Filed: Dec. 3, 2007

(65) Prior Publication Data

US 2008/0150777 A1   Jun. 26, 2008

Related U.S. Application Data

(60) Provisional application No. 60/872,378, filed on Dec. 1, 2006.

(51) Int. Cl.
*H03M 3/00* (2006.01)
(52) U.S. Cl. ............... 341/143; 341/118; 341/120; 341/155
(58) Field of Classification Search ............. 341/118, 341/120, 143, 155
See application file for complete search history.

(56) References Cited

U.S. PATENT DOCUMENTS

| | | | | |
|---|---|---|---|---|
| 5,982,316 A | * | 11/1999 | Shin | 341/143 |
| 6,232,901 B1 | * | 5/2001 | Abbey | 341/143 |
| 6,373,418 B1 | * | 4/2002 | Abbey | 341/143 |
| 6,556,159 B1 | * | 4/2003 | Fei et al. | 341/143 |
| 6,670,902 B1 | * | 12/2003 | Melanson et al. | 341/143 |
| 6,765,520 B1 | * | 7/2004 | Chuang et al. | 341/143 |
| 6,842,129 B1 | * | 1/2005 | Robinson | 341/143 |
| 6,873,276 B2 | * | 3/2005 | Yang et al. | 341/143 |
| 6,980,147 B2 | * | 12/2005 | Mathis et al. | 341/155 |
| 7,221,302 B1 | * | 5/2007 | Melanson | 341/143 |
| 7,248,193 B2 | * | 7/2007 | Fujimoto | 341/143 |
| 7,362,252 B1 | * | 4/2008 | Pai | 341/143 |
| 7,432,840 B2 | * | 10/2008 | Doerrer et al. | 341/143 |
| 7,446,686 B2 | * | 11/2008 | Rueger et al. | 341/143 |
| 2005/0052300 A1 | * | 3/2005 | Ranganathan | 341/143 |
| 2006/0119491 A1 | * | 6/2006 | Gealow et al. | 341/143 |

* cited by examiner

*Primary Examiner*—Linh V Nguyen
(74) *Attorney, Agent, or Firm*—Paul A. Bernkopf; Graybeal Jackson LLP; Bryan A. Santarelli

(57) ABSTRACT

A sigma delta converter system and method includes a multi bit quantizer circuit coupled to an output of the converter. A single bit analog-to-digital converter circuit is contained in a feedback path of the converter. The converter includes a feed forward path operable to multiply an input voltage by a feed forward coefficient having a value that is a function of a gain control input signal. The gain control input signal can have a value that is a function of the output of the multi bit quantizer.

19 Claims, 4 Drawing Sheets

SIGMA DELTA CONVERTER SYSTEM AND METHOD

PRIORITY CLAIM

The present application claims the benefit of U.S. Provisional Patent Application No. 60/872,378, filed Dec. 1, 2006, now expired, which application is incorporated herein by reference in its entirety.

TECHNICAL FIELD

Embodiments of the present invention relate generally to analog-to-digital and digital-to-analog conversion circuits and more specifically to sigma delta conversion circuits.

BACKGROUND

FIG. 1 is a functional block diagram of a conventional first order or single bit sigma delta analog-to-digital (A/D) converter (ADC) 100 that converts an analog input voltage Vin into a corresponding digital output signal DO. The analog input voltage Vin is applied to a non-inverting input of a summation circuit 102 which also receives an analog feedback voltage AF from a single-bit digital-to-analog converter (DAC) 104. The DAC 104 develops the analog feedback voltage AF response to the digital output signal DO. The summation circuit 102 subtracts the analog feedback voltage AF from the input voltage Vin to develop an analog output AO and outputs the analog output to a low pass filter 106. The low pass filter 106, which may be an integrator, filters the analog output AO to generate a filtered analog output FAO and applies this filtered analog output to a quantizer 108. Where the converter 100 is a single-bit circuit, the quantizer 108 is a comparator which compares the FAO output from the filter 106 to a reference voltage and generates the digital output signal DO responsive to this comparison.

In operation, where the converter 100 is a single bit circuit the converter generates a bitstream or series of binary values (0 and 1) for the digital output DO which corresponds to the analog input voltage Vin. The detailed operation of the conventional sigma delta converter 100 is well understood by those skilled in the art and thus, for the sake of brevity, will not be described in more detail herein. A decimation filter (not shown) typically receives the digital output DO and converts the bitstream into a slower stream of multi bit samples, each sample being a digital value representing the value of the analog input voltage Vin. The rate at which the converter 100 operates is typically indicated through a sampling frequency Fs that indicates the rate at which the analog input voltage Vin is sampled and the rate at which the components 102-108 operate on samples of the analog input voltage to generate a corresponding digital output DO for each sample of the analog input voltage. When the converter 100 is a multi-bit converter the quantizer 108 is no longer a single comparator but instead is itself an analog-to-digital converter such as a flash ADC including a bank of comparators.

The converter 100 achieves high-resolution analog-to-digital conversion through the concepts of over-sampling and noise shaping. A system is deemed an over-sampled system when the sampling frequency Fs is many times greater than the minimum required sampling rate given by the Nyquist sampling criteria (i.e., minimum sampling frequency must be twice the maximum frequency Fin of the input signal Vin). For example, in an audio system the highest audible frequency Fin is 20 KHz so that the minimum sampling frequency or Nyquist frequency is 40 KHz (minimum Fs equals 2×Fin=2×20 KHz=40 KHz). The ratio of the sampling frequency Fs to the Nyquist frequency (Fs/2Fin) is defined as the over-sampling ratio (OSR).

Quantization is the process by which a signal is assigned or "quantized" to one among a finite set of levels and this process inherently introduces error. For example, let an input signal be quantized into one of N values in a quantization set and let the distance between each level be $\Delta$. If the input signal has a value exactly in between two levels, then the signal will have to be arbitrarily assigned to one of the two levels. By assigning the input signal to one of the two levels, an error of $\lambda/2$ has been introduced. This error is referred to as quantization error or quantization noise and is statistically independent of the input signal.

If the input signal is sampled at some frequency Fs such that Nyquist's sampling theorem is satisfied, then when the signal is quantized the power of the resulting quantization noise is spread between frequencies 0 to Fs/2. If the frequency band of interest is 0 to Fin, then it follows that increasing Fs will decrease the power of the noise within the band of interest. Mathematically it can be shown that doubling of the sample frequency results in a decrease of the in-band noise power by 3 dB, as will be appreciated by those skilled in the art. The greater the sampling frequency Fs the larger the bandwidth over which this noise power is distributed. If the sampling frequency is much greater than the frequency band of interest (0 to Fin), then the noise within the band of interest is reduced since the total noise power is distributed over a wider range of frequencies.

Using linear signal analysis it can be shown that the filter 106 will have a low pass characteristic to the input signal Vin and a high pass characteristic to the quantization noise, as will be appreciated by those skilled in the art. As a result, the quantization noise can be shifted or "shaped" to reside in a frequency band outside of the frequency band of interest such that this noise can later be filtered out without affecting the input signal. This is known as noise shaping. As previously mentioned, a decimation filter (not shown) receives the DO output. In addition, another low pass filter (also not shown) functions to filter out quantization noise that has been shifted to a higher range of frequencies through noise shaping. The converter 100 is able to achieve high conversion resolutions in the frequency band of interest (i.e., 0 to Fin) by the use of over-sampling and noise shaping. The amount of noise power in the frequency band of interest is a function of the OSR (Fs/2Fin), the order of the filter 106, and the number of bits of the quantizer 108.

Because the noise power in the frequency band of interest is function of the number bits of the quantizer 108, the signal-to-noise ratio (SNR) of the converter 100 is a function of the number of bits of the quantizer 108. The more bits of the quantizer 108 the lower the quantization noise. Accordingly, the use of a multi bit quantizer 108 is generally desirable. When the quantizer 108 is multi bit, however, the DAC 104 in the feedback path from the DO output to the summation circuit 102 must also be a multi bit DAC that develops a multi level analog feedback voltage AF.

One problem arising out of the use of a multi-bit DAC is that due to process variations, the analog elements used in the DAC, such as capacitive and current elements, can be mismatched relative to one another. These mismatches can cause errors among the different levels output from the DAC 104 and thereby result in errors in desired values for the analog feedback voltage AF. Such errors in the feedback voltage AF can result in increased SNR as well as increased total harmonic distortion (THD) of the converter 100. Increased THD can occur because the same errors will always occur between the same levels for the AF output from the DAC 104 (i.e., for the same values of the DO signal). This can add harmonic distortion to the DO signal. Since the feedback voltage AF from the DAC 104 is applied to the summation circuit 102, any errors in this voltage are effectively input to the converter 100m meaning that any errors in the AF voltage from the DAC will appear at the digital output DO of the converter.

To prevent such mismatch errors in the DAC 104 from affecting the AF output and thereby the DO output, the AF output must be corrected before it gets fed back in order to mitigate the resulting mismatch errors. Several conventional techniques have been utilized to compensate for such mismatch errors, with these techniques being collectively known as dynamic element matching (DEM) techniques. The fundamental principle of DEM techniques is to randomize the mismatch effects of the DAC 104 such that the errors are spread out across the frequency spectrum and thereby appear as random noise instead of appearing as noise at discrete tones or harmonics of the input signal Vin. Those skilled in the art will appreciate various DEM techniques commonly utilized, such as Data Weighted Averaging (DWA) and Individual Level Averaging (ILA). Each of these techniques tracks the past utilization of components in the DAC 104 to control the components selected for a current value of the AF voltage to be generated.

These DEM techniques work very well and have been well researched and implemented. The utilization of these techniques does, however, result in increased design cost, as well as increased area occupied by and power consumption of the converter 100. Another approach utilized in the art is a feed forward approach as shown in FIG. 2, which is a functional block diagram of a feed forward sigma delta converter 200 that receives an analog input voltage Vin and generates a corresponding digital output voltage DO. The feed forward sigma delta converter 200 includes a first summation circuit 202 coupled in series with a filter 204, a second summation circuit 206, and a multi bit quantizer 208 that provides the digital output DO of the converter. A multi bit DAC 210 receives the DO output and generates a corresponding feedback voltage AF that is applied to one input of the first summation circuit 202. The input voltage Vin is multiplied by a coefficient a6 in a feed forward path 212 and this value supplied as one input to the second summation circuit 206. The filter 204 includes five integrator stages 205a-3 and is a $5^{th}$ order filter in the example of FIG. 2, with an output from each stage being multiplied by a corresponding coefficients a1-a5 and applied as an input to the second summation circuit 206.

In operation, the feed forward path 212 functions to add a Vin component to the input supplied to the multi bit quantizer 208 such that this component is supplied through the multi bit DAC 210 and subtracted out by the first summation circuit 202 (true since the output of DAC 210 is applied to an inverting input of the first summation circuit 202). In this way, the magnitude of the input signal Vin may be effectively cancelled out before this magnitude is supplied to the filter 204. Cancellation of the input signal Vin in this way enables the filter 204 to be designed to filter unwanted quantization noise, both real quantization noise and harmonics introduced by the multi bit DAC 210. This also reduces the dynamic range of the filter 204 and simplifies its design and implementation.

The cancellation of the input signal Vin is accomplished in the converter 200 as follows. Assume the multi bit quantizer 208, which would be an ADC, has a gain K and that the DAC 210 has a gain L. Accordingly, the input voltage Vin times the coefficient a6 should have a value such that (a6×Vin) cancels out all signals from the filter 204 that are applied to the remaining inputs of the second summation circuit 208. This is true since the input voltage Vin applied through summation circuit 202, filter 204, second summation circuit 206, quantizer 208 and DAC 210 experiences a gain of KL. The value of coefficient a6 is accordingly equal to 1/KL, meaning that a6 times the combined gain of the quantizer 208 and the DAC 210 (i.e., KL) is equal to 1. In this way, ((Vin×a6)=Vin/KL is input to the summation circuit 206, and this component of the out from this summation circuit then experiences the gain KL as it is fed back to the summation circuit 202, so that (Vin/KL)×K×L equals Vin. If the gain of the combination of the quantizer 208 and DAC 210 (KL) is assumed to be relatively constant over the range of operation of these components, then the coefficient a6 has a constant value over this range as well.

Note that the converter 200 includes the multi bit DAC 210 which, as previously discussed, requires the use of DEM techniques and the associated increased design cost and increased area occupied by and power consumption of the converter 200.

SUMMARY

According to one embodiment of the present invention, a sigma delta converter system and method includes a multi bit quantizer circuit coupled to an output of the converter. A single bit analog-to-digital converter circuit is contained in a feedback path of the converter. The converter includes a feed forward path operable to multiply an input voltage by a feed forward coefficient having a value that is a function of a gain control input signal. The gain control input signal can have a value that is a function of the output of the multi bit quantizer.

DETAILED DESCRIPTION

Figure 2:
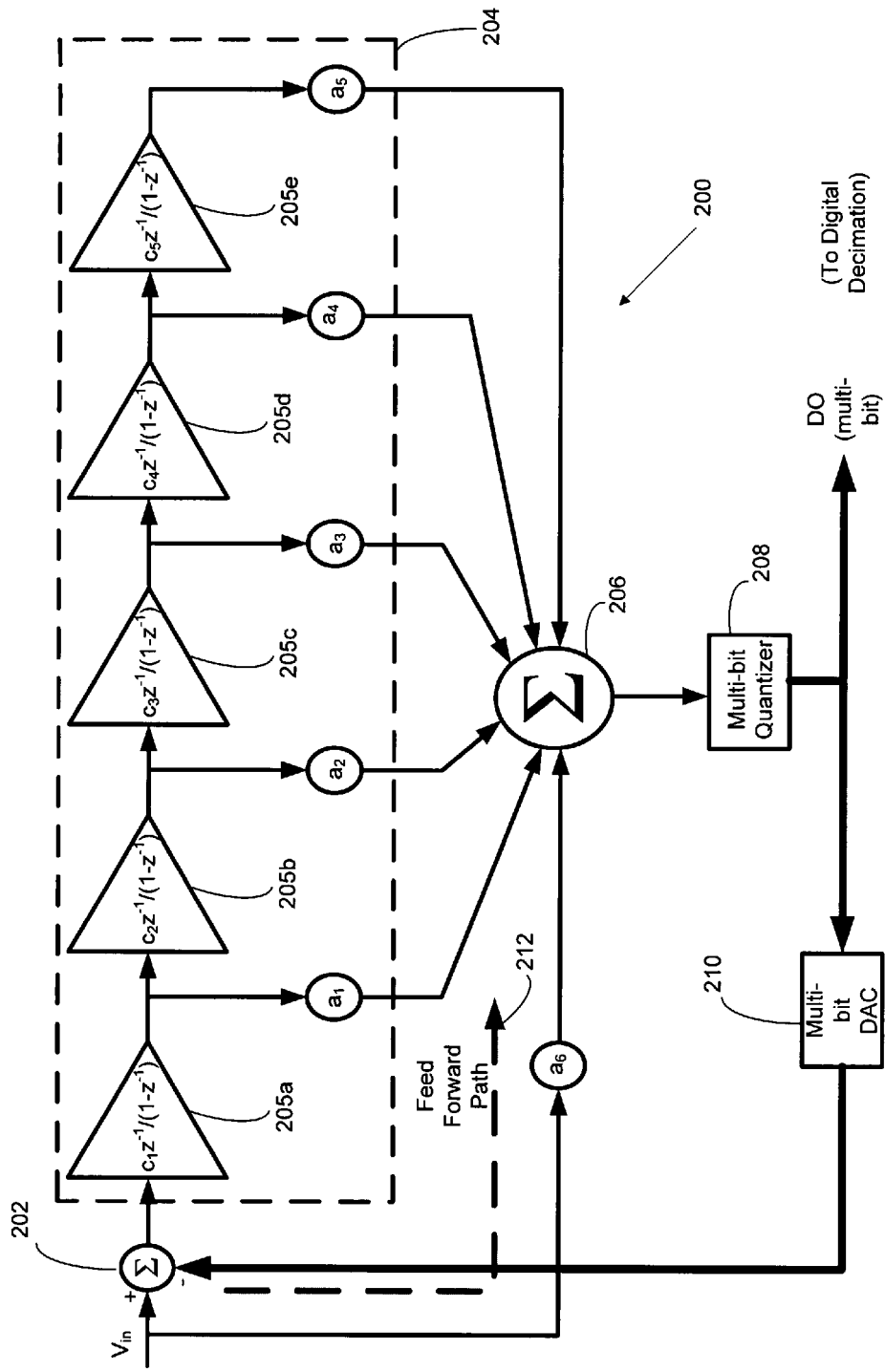
FIG. 2 is a functional block diagram of a conventional feed forward sigma delta converter.
Figure 3:
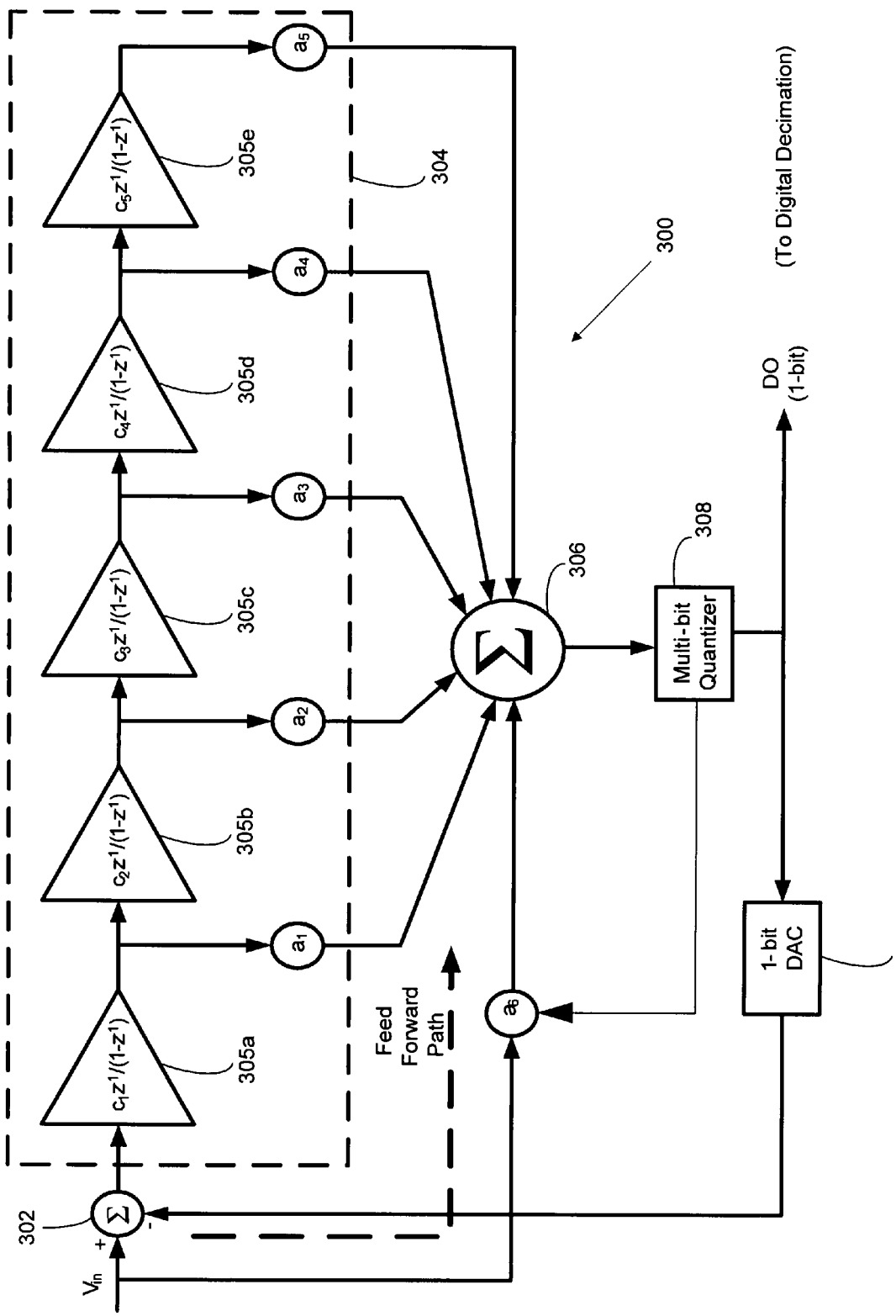
FIG. 3 is functional block diagram of multi bit sigma delta converter including a single bit digital-to-analog converter in the feedback path according to one embodiment of the present invention.

FIG. 3 is functional block diagram of multi bit sigma delta converter 300 including a single bit digital-to-analog converter (DAC) 301 in the feedback path according to one embodiment of the present invention. The use of the single bit DAC 301 is advantageous in that this DAC is smaller and consumes less power at a given clock frequency (e.g., sampling frequency Fs) than does the multi-bit DAC 210 (FIG. 2). The single bit DAC 301 also introduces no harmonic distortion since the DAC is always switching between the same two levels and thus the differences among levels simply do not exist. Accordingly the DEM techniques and associated circuitry and design complexity are not required with the single element DAC 301.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

Figure 1:
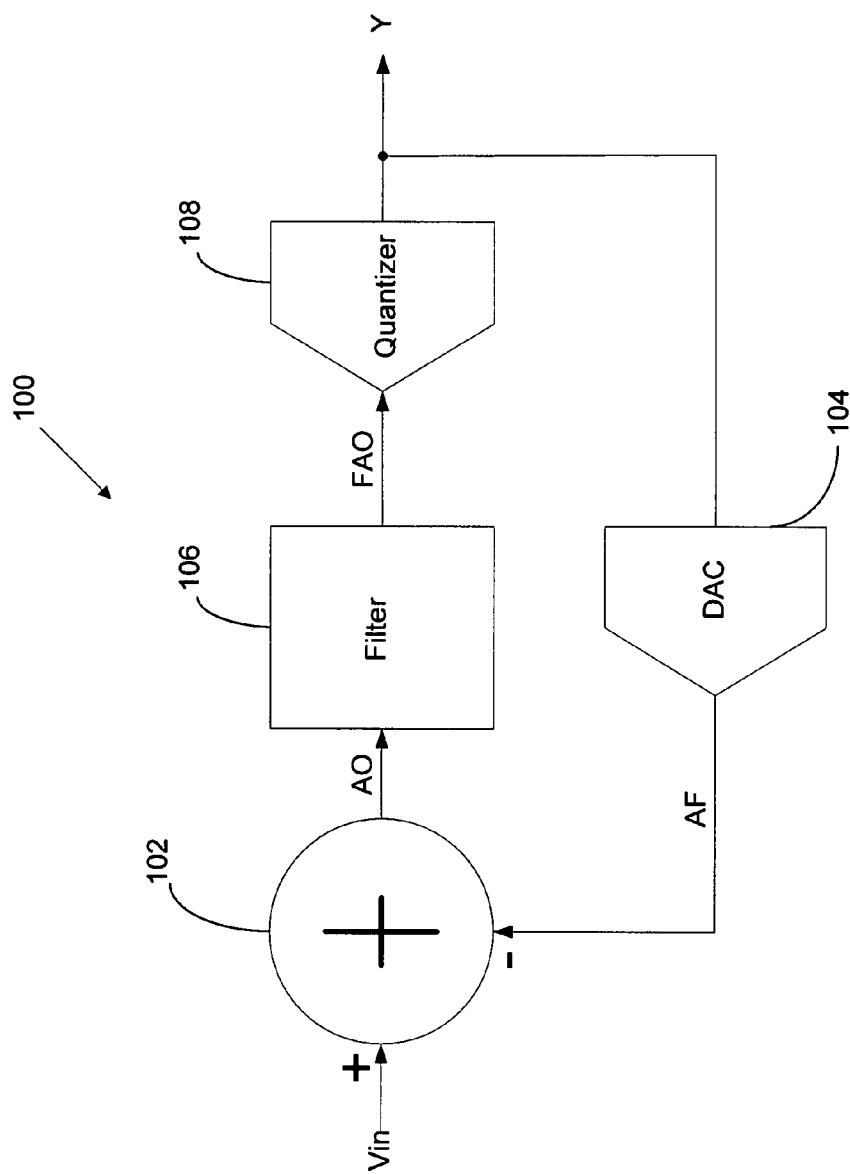
FIG. 1 is a functional block diagram of a conventional sigma delta converter.

The sigma delta converter 300 includes a first summation circuit 302, filter 304, a second summation circuit, and a multi bit quantizer 308 coupled in series between an input and an output of the converter. An input voltage Vin applied on the input is fed forward and multiplied by a coefficient a6, with this product being supplied as one input to the second summation circuit 306. The single bit DAC 301 receives a single bit from the multi bit quantizer 308 that corresponds to the output of the converter 300, and generates a feedback voltage AF supplied to an inverting input of the first summation circuit 302. The multi bit output of the quantizer 308 is utilized to generate a value for the coefficient a6 in the feed forward path. The filter 304 includes five integrator stages 305a-e in the example of FIG. 3. The individual functioning of these components 302-308 has previously been described for the corresponding components with reference to FIGS. 1 and 2 and thus will not again be described in detail.

In operation of the converter 300, the multi-bit quantizer 308 generates a multi bit output that is used not in the conventional manner described with reference to FIG. 2 but instead is used as follows. Although the converter 300 includes the multi bit quantizer 308, only the most significant bit (MSB) of the quantizer is provided as a digital output DO of the converter, effectively making the converter a single bit converter. Moreover, only the MSB of the value output from the quantizer 308 is fed back to the single bit DAC 301. The result of this use of only the MSB of the quantizer 208 is that the effective quantizer gain is no longer well defined, just like for the single bit converter 100 of FIG. 1. The multi bit value from the quantizer 308 is used, however, to "linearize" the effective gain of the quantizer, as will be described in more detail below.

In the converter 300, the feed forward gain (i.e., the value of the coefficient a6) has a value determined by the value of the multi bit output of the quantizer 308. As previously described with reference to FIG. 2, to cancel the input signal Vin the feed forward gain should be equal to 1/(effective gain of quantizer 308× gain of feedback DAC 301). To simplify the present explanation, assume the gain of the DAC 301 equals 1. In this situation, the feed forward gain or value of coefficient a6 equals 1/effective gain of quantizer 308. Now the effective gain of the quantizer 308 varies due to the single bit feedback. In the converter 300, the feed forward coefficient a6 varies to track the gain of the quantizer 308 to achieve the desired cancellation of input Vin. For the single bit DAC 301, the gain is not a constant value over the entire range of the quantizer 308. Instead, the gain is proportional to the actual quantization value from the quantizer 308, which enables the value of the feed forward a6 to be adjusted in response to the value output by the quantizer 3080. In this way, the coefficient a6 times the instantaneous combined gain of the multi bit quantizer 308 and the single bit DAC 301 is always approximately equal to unity.

With the converter 300, the feedback DAC 301 has only two levels and thus the need for DEM techniques described above is eliminated. The considerably reduces the area occupied by and power consumption of the converter 300 when compared to the multi bit converter 200. The increased quantization noise that must be processed or filtered by the filter 304 is no different than for the conventional single bit converter 100 (FIG. 1) and system simulation and circuit design can be used to address deal with this noise, such as the filtering and upshifting of the quantization noise (noise shaping) as previously described.

In one embodiment of the converter 300, the quantizer 308 is a 3-bit quantizer using flash ADC techniques is are which are well known in the art. The 3-bits from the quantizer 308 are decoded into 8 levels which are then used to vary the value of the coefficient a6. In one embodiment, the quantizer 308 is a symmetrical 9-level quantizer that outputs equally spaced values from −1 to +1 with a step size of 0.25. In this embodiment, feed forward coefficient a6 is varied according to the formula a6_new=a6_default+0.025*dout, where dout is the output of the quantizer 308. Thus, a value of +1 will result in a6_new being 0.025 higher than the previous value of a6 (a6_defalut+0.025×1). The total variation of the coefficient a6 is +/−0.025 in the example but larger variations are also possible in other embodiments of the invention.

In another embodiment of the converter 300, the value of the feed forward coefficient a6 is continually adjusted responsive to the analog voltage output from the second summation circuit 306 that is supplied as the input of the quantizer 308. With the converter 300, the quantizer 308 and the feedback path DAC 301 can be run at a higher clock frequency than the filter 304. In another embodiment, a statistical filter such as a Weiner filter is placed between the quantizer 308 and the coefficient a6 (i.e., the circuit that generates the coefficient a6) and is used to extract the statistical value of the effective gain of the quantizer 308. This statistical information is used to accurately modify the feed forward coefficient a6 to track the gain of the quantizer 308.

Figure 4:
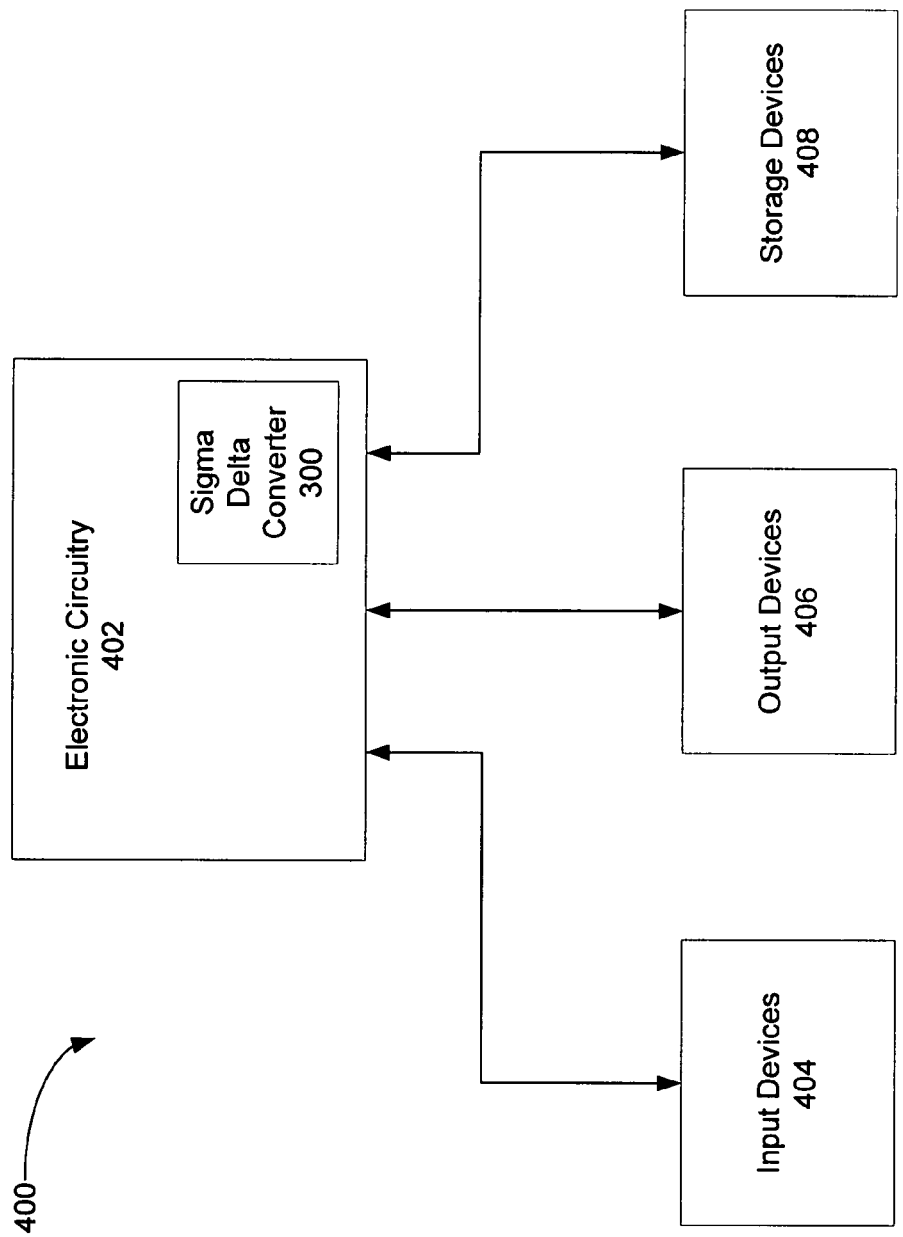
FIG. 4 is a functional block diagram of an electronic system including the sigma delta converter of FIG. 3 according to another embodiment of the present invention.

FIG. 4 is a block diagram of an electronic system 400 including electronic circuitry 402 including the sigma delta converter 300 of FIG. 3 according to one embodiment of the present invention. The electronic circuitry 402 includes circuitry for performing desired computing functions, such as executing specific software or operating to perform a specific function like data conversion and amplification in an audio system. The converter 300 performs desired analog-to-digital conversion during operation of the electronic circuitry 402. The computer system 400 further includes one or more input devices 404, such as an audio input device or keyboard or a mouse, coupled to the electronic circuitry 402. Typically, the computer system 400 also includes one or more output devices 406 coupled to the electronic circuitry 402, such as output devices may be a speaker, video display, and other output devices that depend on the specific function of the system 400. One or more data storage devices 408 may also be coupled to the electronic circuitry 402 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

One skilled in the art will understand that even though various embodiments and advantages of such embodiment have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate, may be realized through software executing on suitable processing circuitry. It should also be noted that the functions performed by the components in the embodiment of FIG. 3 can be combined to be performed by fewer elements or separated and performed by more elements. Therefore, the present invention is to be limited only by the appended claims. Moreover, although only embodiments of sigma delta analog-to-digital converters have been described herein, concepts associated with these embodiments may be applicable to digital-to-analog sigma delta converters as well and to the extent such principles are applicable to such digital-to-analog converters these converters are within the scope of the present invention.

What is claimed is:

1. A sigma delta converter including a multi bit quantizer coupled to an output of the converter and a single bit digital-to-analog converter circuit in a feedback path of the converter, the converter including a feed forward path operable to generate a feed forward value by multiplying an input voltage signal by a feed forward coefficient having a value that is a function of a gain control input signal generated by the multi bit quantizer.

2. The sigma delta converter of claim 1 wherein the gain control input signal is a multi bit output of the multi bit quantizer.

3. The sigma delta converter of claim 1 wherein the converter further comprises:
 a first summation circuit adapted to receive the input voltage on a first input and an analog feedback voltage from the single bit digital-to-analog converter on a second input, and operable to develop an output equal to the difference between the input voltage and the analog feedback voltage;
 a filter including an input coupled to output of the first summation circuit, the filter including plurality of integrator stages connected in series, a first integrator stage being coupled to the input and outputs from each of the stages being output from the filter;
 a second summation circuit coupled to the filter to receive outputs from the integrator stages on respective inputs, and including an input adapted to receive the feed forward value and the second summation circuit operable to sum the values on its inputs and provide a summed value to the quantizer.

4. The sigma delta converter of claim 3 wherein the filter includes five integrator stages.

5. The sigma delta converter of claim 4 wherein the quantizer and the single bit analog-to-digital converter operate responsive to a clock signal having a frequency that is higher than a frequency of a clock signal applied to the filter.

6. The sigma delta converter of claim 3 further comprising a decimation filter coupled to the output of the quantizer to receive a most significant bit output from the quantizer.

7. The sigma delta converter of claim 1 wherein the multi bit quantizer comprises a flash analog-to-digital converter.

8. The sigma delta converter of claim 1 wherein the quantizer has a quantizer gain and the single bit digital-to-analog converter has converter gain, and wherein the gain control input signal has a value so that the feed forward coefficient is approximately equal to 1/(quantizer gain×converter gain).

9. The sigma delta converter of claim 1 wherein the feed forward coefficient varies linearly as a function of the gain control signal.

10. The sigma delta converter of claim 1 further comprising a statistical filter coupled between an output of the quantizer and the feed forward path.

11. The sigma delta converter of claim 10 wherein the statistical filter comprises a Weiner filter.

12. The sigma delta converter of claim 1 wherein the quantizer and feed forward path operate at a sampling frequency Fs having a value that is much greater than a frequency Fin corresponding to the highest frequency component of the input voltage signal.

13. An electronic system, comprising:
 electronic circuitry including a sigma delta converter comprising a multi bit quantizer coupled to an output of the converter and a single bit digital-to-analog converter circuit in a feedback path of the converter, the converter including a feed forward path operable to generate a feed forward value by multiplying an input voltage by a feed forward coefficient having a value that is a function of a gain control input signal generated by the multi bit quantizer;
 at least one input device coupled to the electronic circuitry;
 at least one output device coupled to the electronic circuitry; and
 at least one storage device coupled to the electronic circuitry.

14. The electronic system of claim 13 wherein the electronic circuitry comprise audio circuitry.

15. A method of controlling a feed forward sigma delta converter including a multi bit quantizer and having a feed forward coefficient, the method comprising varying the value of the feed forward coefficient as a function of a gain control signal generated by the multi bit quantizer.

16. The method of claim 15 wherein the method further comprises:
 quantizing a first analog signal with the multi bit quantizer to generate a digital value; and
 adjusting the value of the feed forward coefficient using the generated digital value.

17. The method of claim 15 wherein the gain control signal is derived from an input signal applied to the multi bit quantizer and wherein the method further comprises adjusting the value of the feed forward coefficient responsive to the input signal.

18. The method of claim 15 further comprising performing single bit digital-to-analog conversion on a most significant bit of a digital value output from the multi bit quantizer.

19. The method of claim 15 wherein the feed forward coefficient varies linearly as a function of the gain control signal.

* * * * *